US007579866B1

(12) United States Patent
Hutton et al.

(10) Patent No.: US 7,579,866 B1
(45) Date of Patent: Aug. 25, 2009

(54) PROGRAMMABLE LOGIC DEVICE WITH CONFIGURABLE OVERRIDE OF REGION-WIDE SIGNALS

(75) Inventors: Michael D. Hutton, Mountain View, CA (US); David Cashman, Toronto (CA); Jinyoung Yuan, Cupertino, CA (US); Kimberly Anne Bozman, Toronto (CA)

(73) Assignee: Altera Corporation, San Jose, CA (US)

( * ) Notice: Subject to any disclaimer, the term of this patent is extended or adjusted under 35 U.S.C. 154(b) by 33 days.

(21) Appl. No.: 11/479,311

(22) Filed: Jun. 30, 2006

Related U.S. Application Data

(60) Provisional application No. 60/775,995, filed on Mar. 31, 2006.

(51) Int. Cl.
*H03K 19/173* (2006.01)
*H01L 25/00* (2006.01)
(52) U.S. Cl. .............................. 326/41; 326/38; 326/47; 326/101
(58) Field of Classification Search .................. 326/41, 326/47
See application file for complete search history.

(56) References Cited

U.S. PATENT DOCUMENTS 7,167,021 B1 * 1/2007 Lewis ........................... 326/37

2005/0127944 A1 * 6/2005 Lewis et al. ..................... 326/41

OTHER PUBLICATIONS

Xilinx, "Virtex-5 Data Sheet: DC and Switching Characteristics," http://direct.xilinx.com/bvdocs/publications/ds202.pdf, 71 pages, (v.3.4) Jul. 26, 2007.
Xilinx, "Spartan-3A DSP FPGA Family: Data Sheet," http://direct.xilinx.com/bvdocs/publications/ds610.pdf, 98 pages, Jul. 16, 2007.
Altera, "Cyclone III Device Handbook," http://www.altera.com/literature/hb/cyc3/cyclone3_handbook.pdf, 514 pages, 2007.
Altera, "Stratix III Device Handbook," http://www.altera.com/literature/hb/stx3/stratix3_handbook.pdf, 784 pages, 2007.

* cited by examiner

*Primary Examiner*—Thienvu V Tran
(74) *Attorney, Agent, or Firm*—Weaver Austin Villeneuve & Sampson LLP

(57) ABSTRACT

A programmable logic device architecture providing efficient configurable functionality to allow the "tie-off" of logic region-wide control signals. This functionality is provided while maintaining the efficiency of region-wide signals, yet allows sufficient flexibility for effective use of register-packing and usage within the region. Methods are given for both sub-region and individual logic element tie-off granularity. In various embodiments, the tie-off logic may be used for logic wide signals used in PLDs having logic elements arranged in regions of logic, sometimes referred to in the industry as either Logic Array Blocks or Complex Logic Blocks.

24 Claims, 10 Drawing Sheets

```
if sclr
   if (rslden + regcasc)
      REG_IN = 0
   else
      REG_IN = LUTOUT
else if sload = 1
   if (rslden + regcasc)
      REG_IN = C'
   else
      REG_IN = LUTOUT
else if (regcasc)
   REG_IN = rcasc_in
else
   REG_IN = LUT_OUT
```

PROGRAMMABLE LOGIC DEVICE WITH CONFIGURABLE OVERRIDE OF REGION-WIDE SIGNALS

CROSS-REFERENCE TO RELATED APPLICATION

This application claims priority to U.S. Provisional Application No. 60/775,995 filed on Mar. 31, 2006 and entitled "PROGRAMMABLE LOGIC DEVICE WITH CONFIGURABLE OVERRIDE OF REGION-WIDE SIGNALS" which is herein incorporated by reference.

BACKGROUND

1. Field of the Invention

The present invention generally relates to programmable logic devices, and more particularly, to the efficient distribution of signals which span across Logic Array Block (LABs) in programmable logic devices to improve the efficiency of distributing logic within the device.

2. Description of Related Art

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to as Logic Array Blocks or LABs, contain one or more basic logic elements used to implement logic functions on the device. The basic logic elements are referred to by a variety of names such names as Logic Elements (LEs), Adaptive Logic Modules (ALMs), or Complex or Configurable Logic Blocks (CLBs). Hereafter, for the sake of simplicity the basic logic elements will be referred to as "Logic Elements" or LEs. Regardless of the variety, the logic elements usually include one or more look up table (LUTs), registers for generating registered logic outputs, adders and other circuitry to implement various logic and arithmetic functions.

The Stratix® device is one type of commercially available PLD, offered by Altera Corporation, assignee of the present application. The Stratix® PLD includes an array of LABs arranged in rows and columns and interconnected by horizontal and vertical lines of various lengths. Most relevant to the present invention, each LAB includes, among other elements, 10 logic elements or LEs, a local interconnect, and LAB wide control signals. The local interconnect transfers signals between LEs in the same LAB. The LAB wide control signals include two clocks, two clock enables, two asynchronous clears (ACLR), synchronous clear (SCLR), asynchronous preset/load, synchronous load (SLOAD) and add/subtract load signals. Some of the aforementioned signals are considered to be "LAB-wide" because they are globally applied to each Logic Element in the LAB. With the current Stratix architecture, there is no way to individually apply one of these control signals to one logic element but not the other logic elements in the LAB.

The SCLR signal controls the output of the register in each Logic Element in the LAB. If the SCLR signal is asserted, the output of every register in each Logic Element is force to a logic zero. If the SCLR signal is not asserted, then register output equals the output of the associated Look Up Table (LUT) in each Logic Element respectively. If the SLOAD control signal is asserted, then the output of each register is equal to SDATA respectively. SDATA is either a pre-designated value or it is a data value derived from some other function or location on the device. When the SLOAD signal is not asserted, then again the output of the registers of each Logic Element is the output of the associated Look Up Table respectively.

The SCLR and SLOAD signals are typically used when the Logic Elements of a LAB are configured to operate as counters. For example, when the SCLR signal in the LAB is asserted, the registered output of each Logic Element is forced to zero, effectively resetting the counter. The SLOAD and SDATA signals are used when counter is to be reset to some non-zero value. For example, if the counter is to be reset to the value (1, 0, 1, 0, 1 . . . 0), then the SDATA signals are set to (1, 0, 1, 0, 1 . . . 0) and the SLOAD signal is asserted. When this occurs, the output of the registers of each Logic Element in the LAB will be set to (1, 0, 1, 0, 1 . . . 0) respectively.

The problem with the aforementioned arrangement is that the LAB wide control signals are commonly shared among all of the Logic Elements in the LAB. There is currently no way to individually apply the control signals to one or more select Logic Elements in a LAB. This is particularly troublesome with regard to the efficient use of the hardware resources on the PLD in implementing logic. For example, consider a LAB with ten (10) Logic Elements that is configured to implement a six (6) bit wide counter. In this situation, the registers of six of the Logic Elements are used for the counter. The remaining four Logic Elements, however, can only be used for implementing combinational logic since their registers are controlled by the LAB wide control signals SCLR and/or SLOAD. It is therefore difficult to use the remaining registers for implementing logic. The ability or efficiency to "pack" the LAB with logic is therefore significantly reduced.

One known remedy for the above-mentioned packing problem is to apply the LAB wide control signals such as SCLR, SLOAD, ACLR, etc. individually to each Logic Element in the LAB. As a practical matter, however, to do so is very expensive in terms of an actual silicon implementation. The LAB would require significantly more resources such as interconnect, input muxes, configuration bits, etc. to provide a full set of the LAB wide control signals individually to each Logic Element in the LAB. While applying the control signals to each Logic Element in the LAB would substantially eliminate the logic packing issue, it would create a host of other problems. Additional interconnect, muxing, and configuration bits would be needed within the LAB to individually apply the LAB wide control signals to each Logic Element in the LAB. While the LAB wide control signals could be individually applied to each Logic Element, PLD designers have chosen not to because the overhead in terms of the use of space and resources within the LAB are too significant.

A PLD architecture with improved distribution of control signals within a region including one or more logic elements to increase the packing of logic among the logic elements in the region is therefore needed.

SUMMARY OF THE INVENTION

A programmable logic device architecture providing efficient configurable functionality to allow the "tie-off" of region-wide control signals is provided. This functionality is provided while maintaining the efficiency of region-wide signals, yet allows sufficient flexibility for effective use of register-packing and usage within the region. Methods are given for both sub-region and individual logic element tie-off granularity. In various embodiments, the tie-off logic may be used for logic wide signals used in PLDs having logic elements arranged in regions of logic, sometimes referred to in the industry as either Logic Array Blocks or Complex or Configurable Logic Blocks.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention. Further, it should be noted that the techniques of the present invention could be applied to a variety of systems or electronic devices such as programmable devices and application-specific integrated circuit (ASIC) devices.

Figure 1:
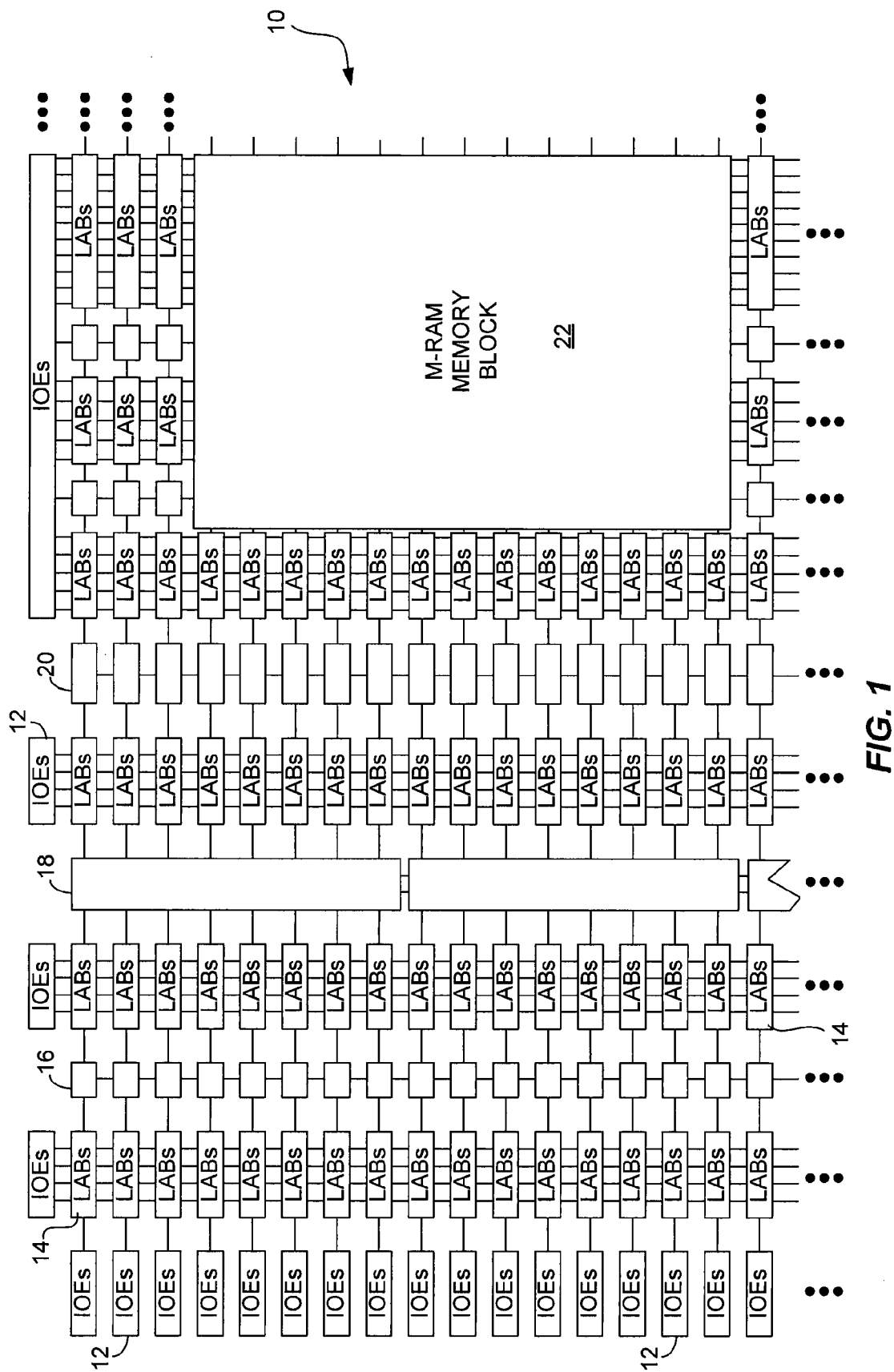
FIG. 1 a block diagram of an exemplary Programmable Logic Device (PLD) of the present invention is shown.

Referring to FIG. 1, a block diagram of an exemplary Programmable Logic Device (PLD) of the present invention is shown. The PLD 10 includes a two dimensional row and column based architecture including a plurality of Input/Output elements (IOEs) 12 arranged around the periphery of the chip, a plurality of Logic Array Blocks (LABs) 14 grouped into rows and columns across the device, Random Access Memory (RAM) blocks 16 grouped into columns between certain LABs 14, Digital Signal Processing (DSP) blocks 18 grouped into columns across the device, second RAM blocks 20 also grouped into columns across the device and between certain LABs 14, and one or more M-RAM memory blocks 22 each provided at different locations across the device.

In one embodiment, the LABs 14 include a number of logic elements (LEs) (not visible in the figure) which are the basic logic building blocks for implementing user defined logic functions. The RAM blocks 16 are memory blocks with a predetermined number of bits and additional parity bits. The RAM blocks 16 provide dedicated simple dual port or single port memory for the device. The DSP blocks 18 are provided for performing digital signal processing functions, such as for example, finite impulse response (FIR) and infinite impulse response (IIR) filters. The second RAM blocks 20 are true dual port memory blocks with memory bits and parity bits. Finally, the M-RAM memory blocks 22 are large true dual port memory blocks with both memory and parity bits.

It should be noted that the PLD 10 is merely exemplary and in no way should be construed as limiting the invention. For more information on the specific PLD architecture 10 illustrated in FIG. 1, see for example the Stratix Architecture, Functional Description, pages 2-1 through 2-140, from the Altera Corporation, July, 2005 (Altera Internal document Number S51002-3.2), incorporated by reference herein for all purposes. The present invention, however, as described in detail below can be implemented in any type of programmable logic device that relies on or uses Look Up Tables (LUTs) arranged in Logic Array Blocks, such a Complex Logic Blocks as used and defined by Xilinx Corporation, for implementing logic functions.

Figure 2:
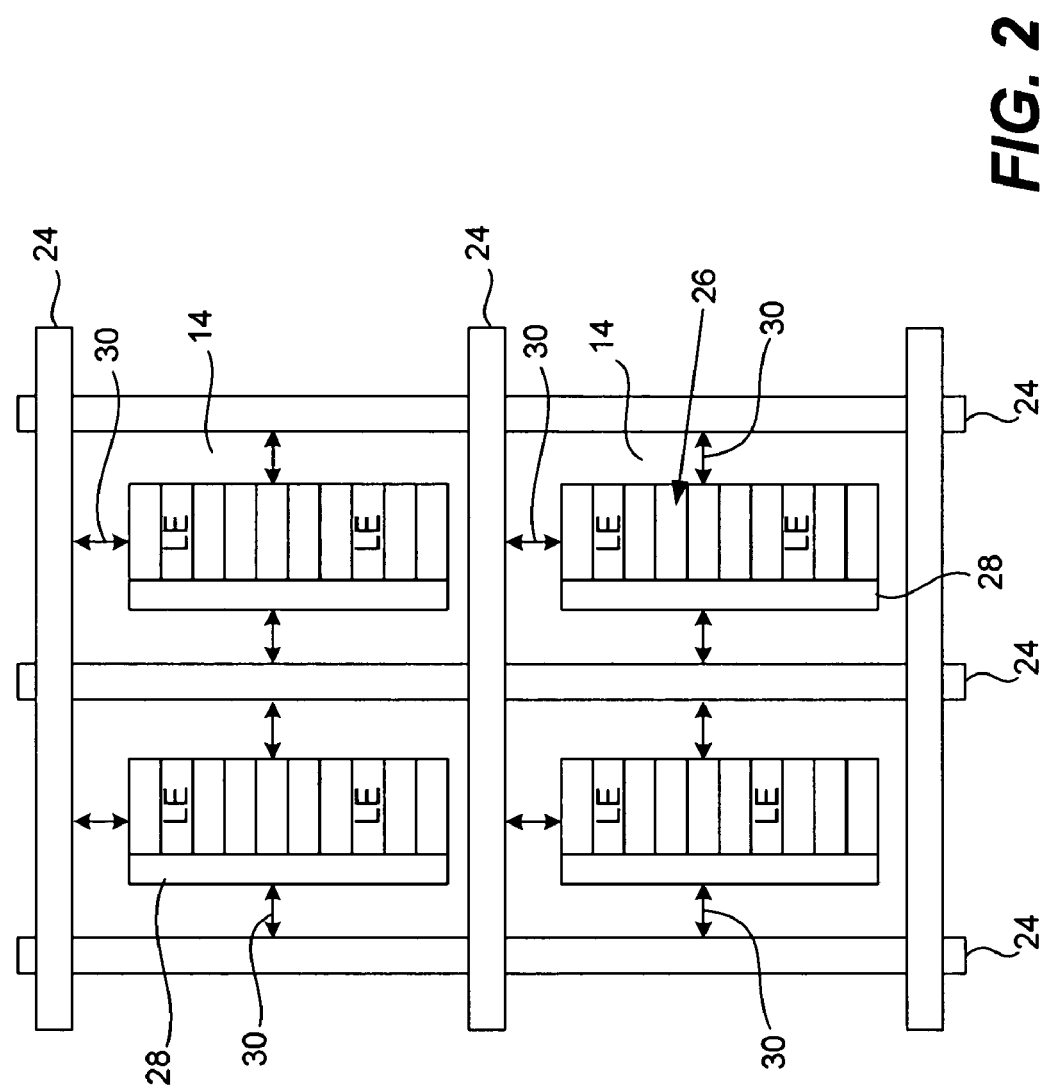
FIG. 2 is a block diagram of several logic array blocks (LABs) in the exemplary PLD of the present invention.

Referring to FIG. 2, a block diagram of several logic array blocks (LABs) in an exemplary PLD is shown. The figure shows four LABs 14 interconnected by a plurality of general horizontal (row) and vertical (column) interconnect lines 24. Each LAB 14 includes a plurality of logic elements (LEs) 26. In the embodiment shown, there are ten (10) LEs 26 per LAB 14. It should be noted that this number is arbitrary, and that any number of LEs 26 may be used per LAB 14. A LAB interconnect 28 is also provided to interconnect the LEs 26 within each LAB 14. Interconnects 30 are provided between the LEs 26 of each LAB 14 and the general horizontal and vertical interconnects 24.

Figure 3:
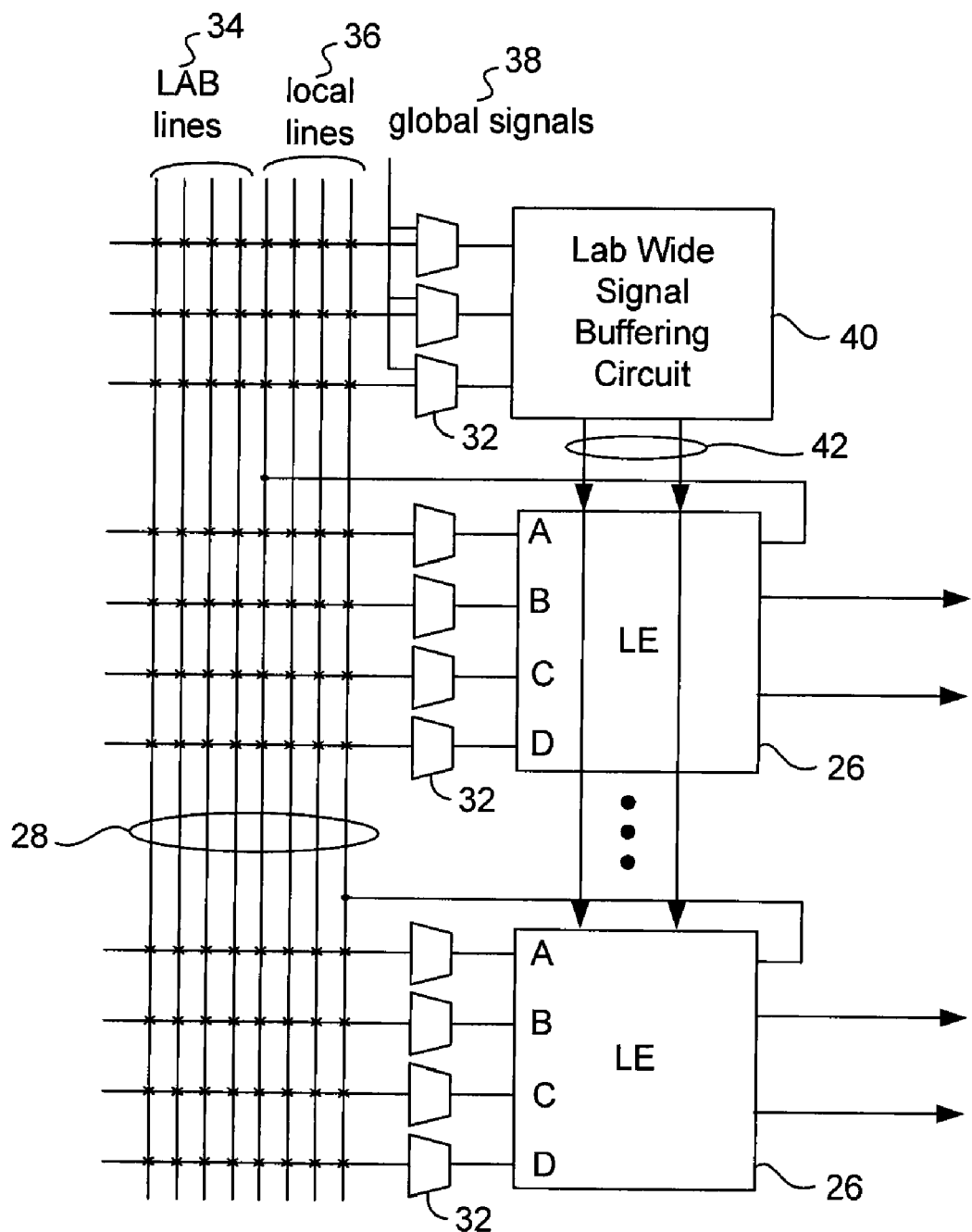
FIG. 3 is a block diagram showing the distribution of LAB wide signals in a LAB.

Referring to FIG. 3, a portion of a LAB 14 is shown. The LAB 14 includes a plurality of LEs 26 arranged in a vertical column (for the sake of simplicity, only two LEs 26 are illustrated). Each LE 26 has four inputs labeled A, B, C and D. The four inputs are configured to receive inputs through muxes 32 respectively. The LAB interconnect 28 includes LAB lines 34, local lines 36 and global signals 38 which can each be selectively provided to the A, B, C, and D inputs of the LEs 26 through the muxes 32. A LAB wide signal buffering circuit 40 is also provided. The buffering circuit 40 is configured to generate and provide the LAB wide signals 42, such as SCLR, SLOAD, ACLR, etc. These signals shall be referred to herein generically as LAB wide signals for the sake of simplicity, however it should be made clear that the principles of the invention apply equally to any region or sub-region in which such signals could reasonably occur. As illustrated in the Figure, the LAB wide signals 42 are applied to each of the LEs 26 in the LAB 14.

Figure 4:
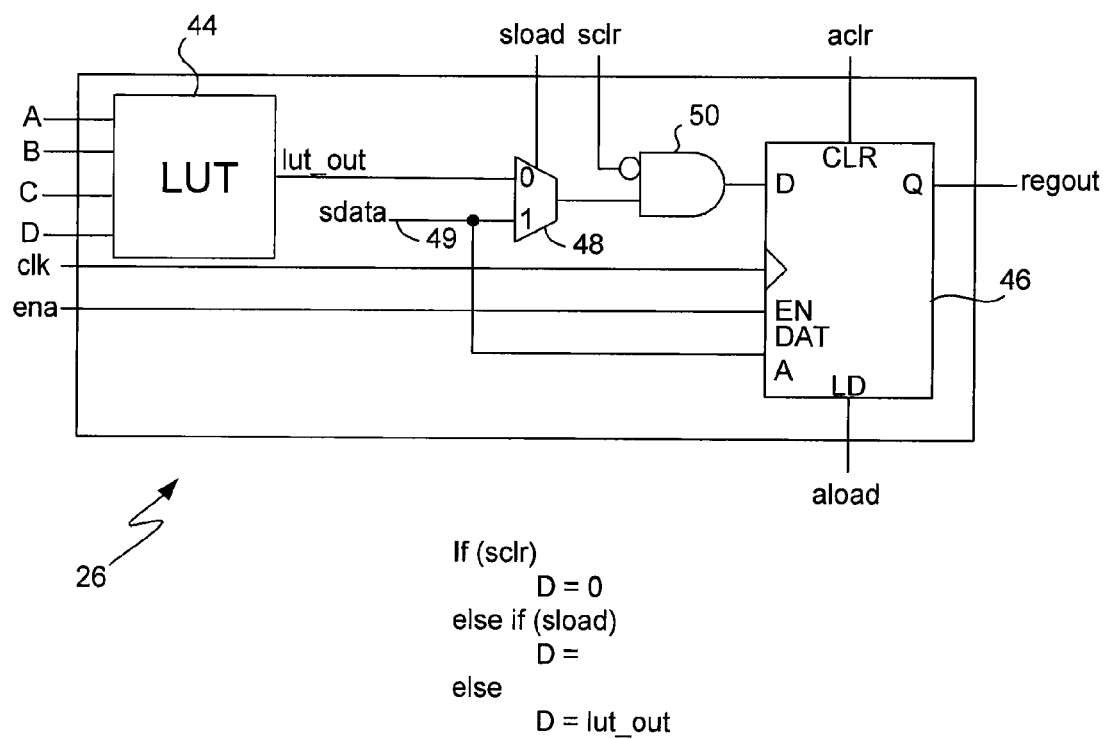
FIG. 4 is a logic block diagram of a Logic Element illustrating the operation of the SLOAD and SCLR functionality associated with a register.

Referring to FIG. 4, a simplified functional block diagram of a Logic Element (LE) 26 is shown. Each LE 26 includes a LUT 44, a register 46, mux 48 and AND gate 50. The LUT 44 is configured to receive the four inputs A, B, C and D. The mux 48 is configured to receive the output of the LUT 44 (lut_out) and SDATA 49 and is controlled by the LAB wide signal SLOAD. In many common implementations, the SDATA signal 49 is derived from one of the LUT inputs A, B, C, and D. AND gate 50 is coupled to receive the output of mux 48 and the LAB wide signal SCLR. The D-input of register 46 is connected to the output of AND gate 50. The register 46 is also configured to receive LAB wide signals ACLR and ALOAD and to generate a register output at Q labeled "regout".

During operation, when the LAB wide signal SCLR is asserted, then the D input to register 46 is a logic zero. If the LAB wide signal SLOAD is asserted, then the D input to register 46 will also be a logic zero. If neither SCLR or SLOAD are asserted, then the D input to the register 46 equals the output of LUT 44 (lut_out). It should be noted that LE 26 illustrated in FIG. 4 has been simplified for the sake of clarity. For more details of the LE 26, see the above mentioned Stratix documentation, incorporated by reference herein.

Figure 5:
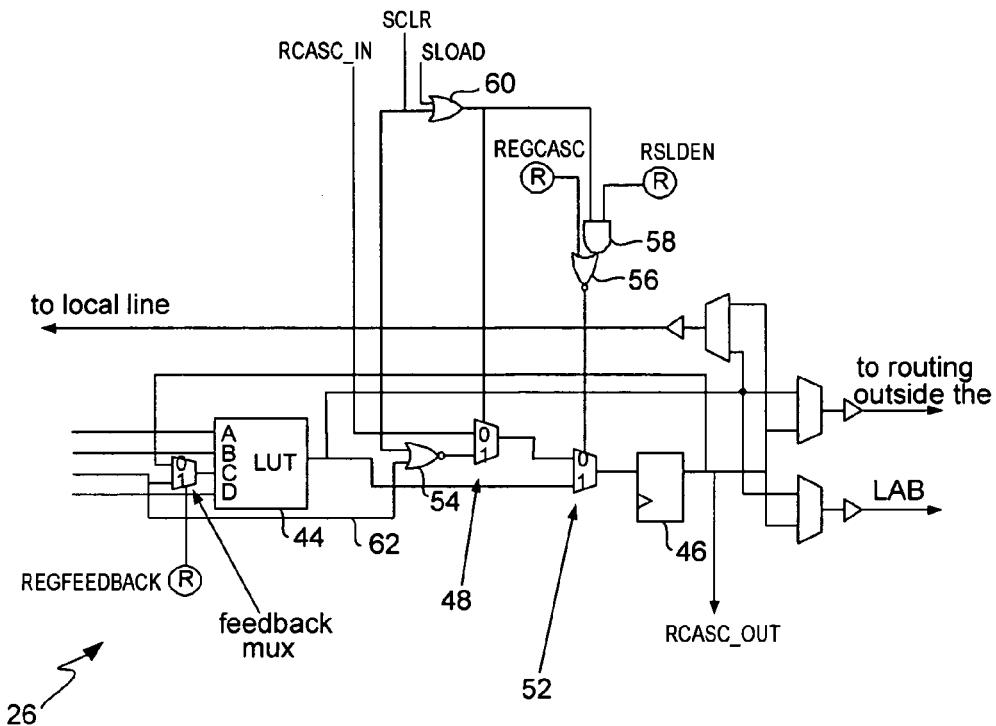
FIG. 5 illustrates an exemplary logic block diagram implementing additional features in addition to SLOAD and SCLR, including configuration bits.

Referring to FIG. 5, a more detailed logic diagram of an LE 26 is shown. The LE 26 includes the LUT 44 coupled to receive inputs A, B, C and D, mux 48, register 46, mux 52, NOR gate 54, NOR gate 56, AND gate 58 and OR gate 60. The NOR gate 54 is configured to receive an input 62 and the configuration bit RCASC_IN (assert register-cascade functionality), mux 48 is configured to receive signal RCASC_IN (register cascade output of the adjacent logic element) and the output of NOR gate 54 and the output of OR gate 60 as its select input. Mux 52 is configured to receive the output of LUT 44 and the output of mux 48 and the output of NOR gate 56 as its select input. The output of mux 52 is coupled to the input (REG_IN) of the register 46. NOR gate 56 is configured to receive at its input configuration bit R labeled REGCASC and the output of AND gate 58. AND gate 58 is coupled to receive configuration bit R labeled RSLDEN and the output of OR gate 60. OR gate 60 is configured to receive Lab wide signals SLOAD and SCLR. This logic diagram is exemplary, and many other implementations accomplishing the purposes of selecting results of region-wide control signals using SRAM or other programming bits can be used. In this and future diagrams signals denoted by ® are configuration bits of the programmable logic device. It is often the case that such configuration bits serve multiple purposes such as "SLOADORCLR" but in this particular diagram each configuration bit has an independent purpose. It should be noted that the compound signal SLOADORCLR is exemplary and that other compound signals may be used such as but not limited to SET-RESET (SR), a toggle signal, or a data value signal.

A truth table 62 is provided in FIG. 5 for the purpose of describing the operation of the logic element 26. For example, setting the configuration bit RSLDEN in the configuration of the device, and then connecting the SLOAD input to a signal which swings high will cause the FF to reset itself to logic zero (0). Other features of the Logic Element are that the C input can optionally be overridden by the output of the register using the REG FEED BACK config bit, and that the C input can also be "stolen" from the LUT 44 to directly drive the register 46 through control of the SCLR and SLOAD signals as mentioned in the discussion of FIG. 4 for SDATA input 49.

Figure 6:
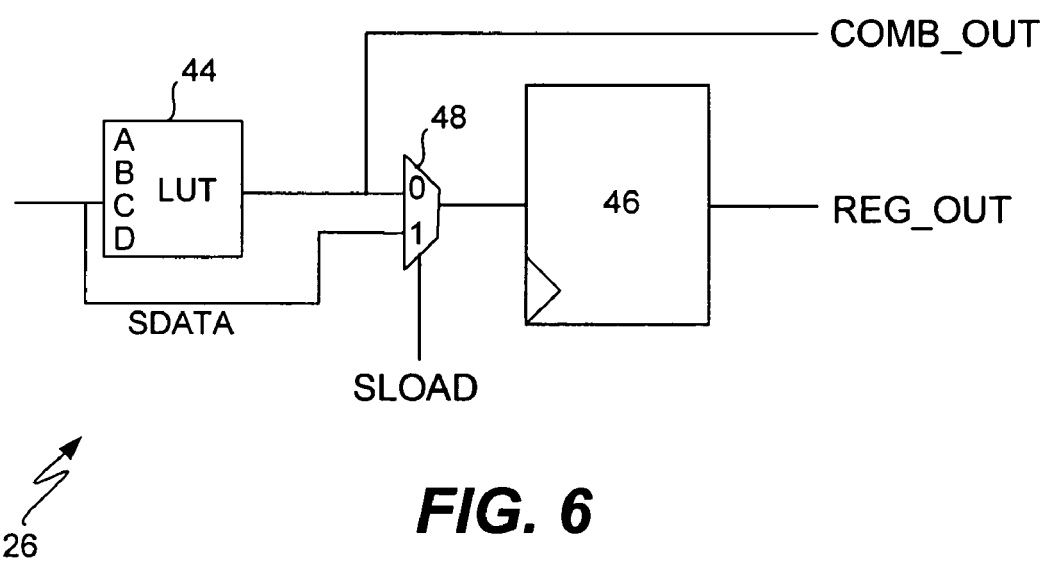
FIG. 6 illustrates the application of the SLOAD circuitry to register packing.

Referring to FIG. 6 a simple block diagram of an LE 26 for the purposes of illustrating register packing is shown. Register packing refers to the operation of placing a register in the same logic element as an un-related 3-LUT, which differs from the normal mode of a 4-LUT which optionally drives its dedicated register. Register packing allows for more efficient use of logic elements, because the dedicated registers that are not used in some logic elements can be put to productive use, provided there is an input available to the LUT to generate the data-in signal for the register. The mux 48 is controlled by the Lab wide control signal SLOAD. When SLOAD is asserted, SDATA is selected and applied to the input of the register 46 while the output of LUT 44 is provided through the combinational output (COMB-OUT). In this way, the SLOAD signal can also be interpreted to be the enabling signal for register packing.

Register packing can be generalized to larger LUTs and different logic element structures. When placed in a LAB which uses LAB wide SLOAD or SLOADCLR signals globally, the ability to do register packing is hampered. This is because there is a conflict between Logic Elements 26 which need the global controlling signal SLOAD (or shared signal RSLOADCLR) to be high for register packing, and those which need RSLOADCLR low to disable SLOAD.

The present invention is directed toward the efficient disabling of LAB wide control signals (42 in FIG. 3), thereby achieving the flexibility needs substantially equivalent to applying the LAB wide control signal per Logic Element secondary signal generation, while maintaining the silicon cost of the shared scheme. The disabling circuitry can be referred to as a "tie-off" circuitry because it typically forces or "ties" the value of some control signal, either to VCC or GND, and thus overrides the behavior dictated by the LAB-wide control signal.

Two classes of embodiments are shown. In the first set of embodiments, various circuits for individual Logic Element "tie-offs" are presented. In the second set of embodiments, methods for half-lab (or other granularity) tie-offs are presented. Further embodiments try to claim the software modifications required to effectively use the hardware of the current invention.

For the sake of example, the present application refers mostly to the SLOAD signal and with application to improving the ability to do packing of registers with unrelated LUTs. However, the principles of the invention are equally applicable to any logic block having a plurality of LUT based logic elements. For example, the present invention applied equally to the LAB wide control signal 42 of the Altera PLD architecture, such as ALOAD, ACLR, SCLR signals, or the SR or BX/BY signals in Slices of Complex Logic Blocks used in the programmable logic devices offered by Xilinx. The tie-off circuits of the present invention are also equally applicable for other signals which have a dual purpose such as "SLOADORCLR", which encodes that one or both of SLOAD and SCLR are set for the region.

Figure 7:
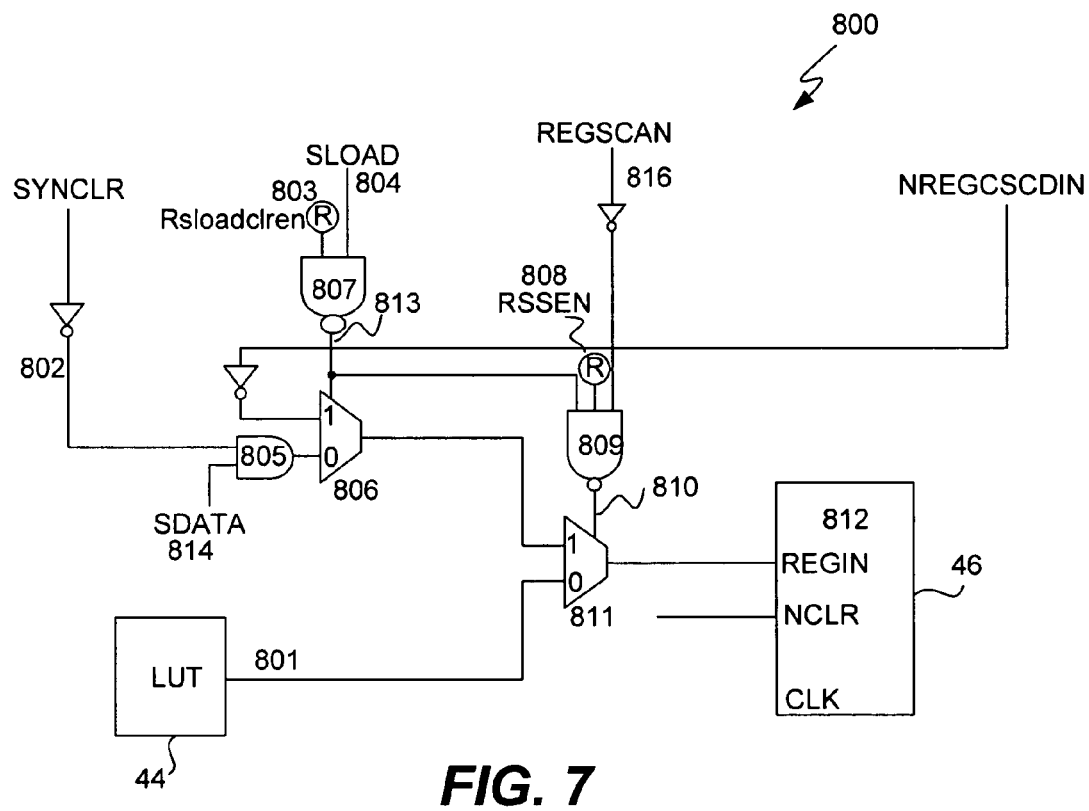
FIG. 7 illustrates a further exemplary logic block diagram showing the operation of SLOAD, SCLR and shared configuration bits.

Referring to FIG. 7, a circuit 800 for distributing LAB wide control signals to a known Logic Element is shown. In this example, AND gate 805 is configured to receive SDATA signal 814 and a SYNCLR signal through inverter 802. Mux 806 is configured to receive the output of AND gate 805 and the NREGCSCDIN signal through an inverter (in general the prefix N on a named signal or configuration bit indicates that the signal or configuration bit has the opposite polarity of it's denoted name). The select input 813 provided to mux 806 is generated by the output of NAND gate 807. Mux 811 is configured to receive the output of mux 806 and the LUT 44 output 801. The select input 810 of mux 811 is received from the output of NAND gate 809. The output of mux 811 is provided to the input of register 46. NAND gate 807 is configured to receive the signal SLOAD 804 and the contents of a configuration bit R 803 labeled Rsloadclren. NAND gate 809 is configured to receive the output of NAND gate 807, a configuration bit R 808 labeled RSSEN, and signal REGSCAN 816 through an inverter. This diagram illustrates the use of multiple configuration bits to accomplish the combined goal of applying the required functionality to the register. In FIG. 7, each individual logic element is forced to accept the incoming SLOAD and SYNCLR signals generated at the LAB-wide level.

Figure 8A:
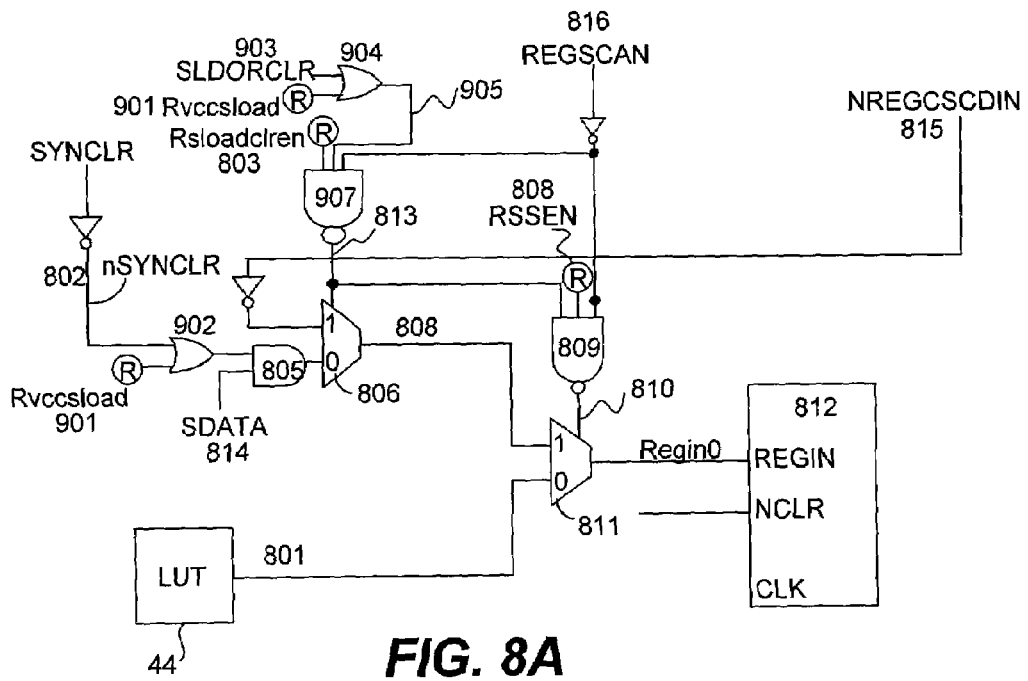
FIG. 8A shows an exemplary embodiment of the present invention in which the SLOAD signal can be tied-off independent of region-wide signals.

Referring to FIG. 8A, an exemplary tie-off circuit according to the present invention is shown. This circuit is similar to the basic circuit of FIG. 7, but includes a number of changes. A configuration bit RVCCSLOAD is used to condition the nSYNCLR signal (force it to 1), and thus allow the SDATA signal to continue through selection mux 806 independent of SYNCLR. At the same time the NAND gate 907 is controlled by the lab-wide SLDORCLR signal and similarly conditioned by the RVCCSLOAD configuration bit and the RSLOADCLREN bit. By setting the RVCCSLOAD bit to VCC, signal 905 is forced to VCC. A further change to this particular embodiment is required to maintain the priority of the register scan-chain 816 by allowing it to override the RVCCSLOAD tie-off. It should be recognized that the additional hardware gates and input connections described are applicable to the specific logic cell structure of FIG. 7. Alternative specific hardware gates and connections to achieve the tie-off of LAB or region-wide signals to other initial logic elements and registers are possible under the principles of this invention.

Figure 8B:
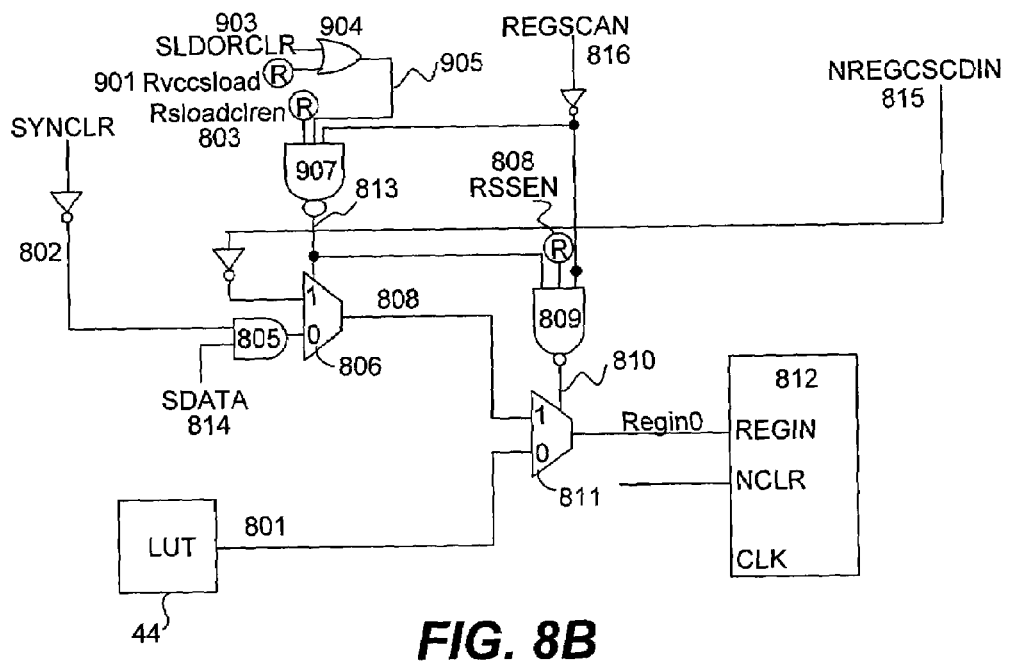
FIG. 8B shows an alternative embodiment of the present invention in which the SLOAD signal can be tied-off independent of region-wide signals, and which the priority of such signals can be altered using the configurable tie-off functionality.

In another embodiment as illustrated in FIG. 8B, the OR gate 902 is removed, providing SYNCLR priority over SDATA by allowing the data input of logic zero to mux 806 to continue to be forced to zero by the SYNCLR signal. With this embodiment, the use of the configuration tie-off bits are used in combination to modify priorities among the LAB wide control signals 42.

Figure 8C:
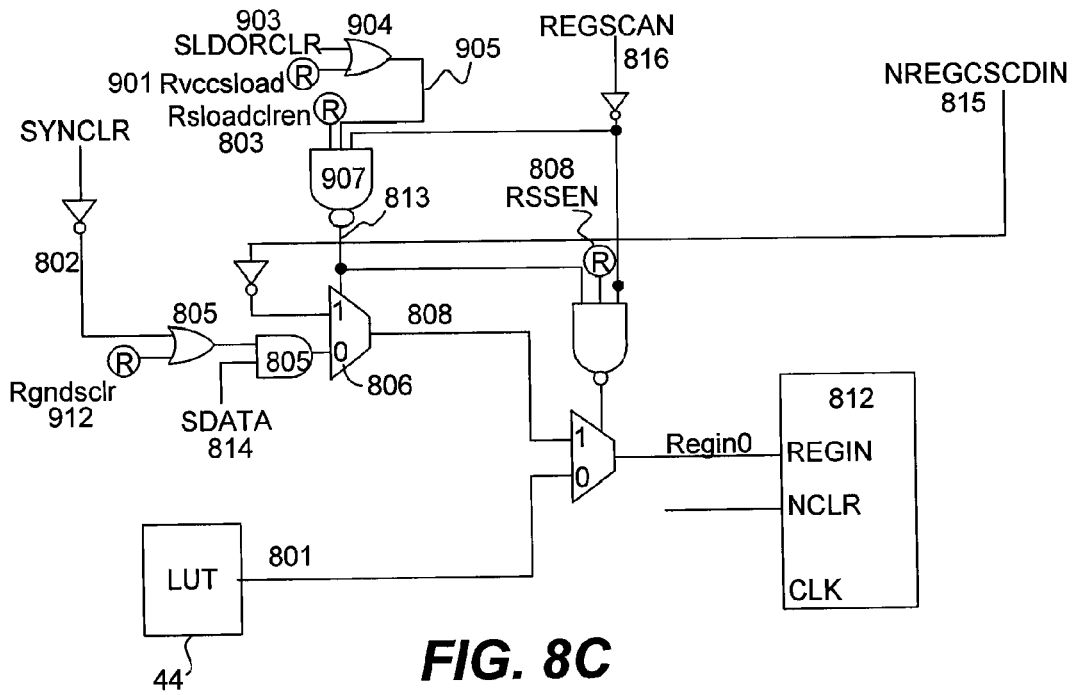
FIG. 8C shows a further alternative embodiment of the present invention in which the SLOAD signal can be tied-off independent of region-wide signals.

In yet another embodiment as shown in FIG. 8C, the RVCCSLOAD signal (901) of FIGS. 8A and 8B is split into two configuration bits to add flexibility. RVCCSLOAD continues to condition the OR-gate 904, but the addition of configuration bit RGNDSCLR 912 controls the OR-gate 805. This gives dynamic control over the priority of the SLOAD and SYNCLR block wide control signals, when the following conditions are met: (i) RGNDSCLR=GND, and (ii) the OR-gate 805 "disappears" as in FIG. 8B. When RGNDSCLR=VCC we get the operation of FIG. 8A. Thus, the embodiment shown in FIG. 8C, is a superset of the previous two embodiments, albeit with some additional hardware cost (the extra SRAM configuration bit).

Figure 8D:
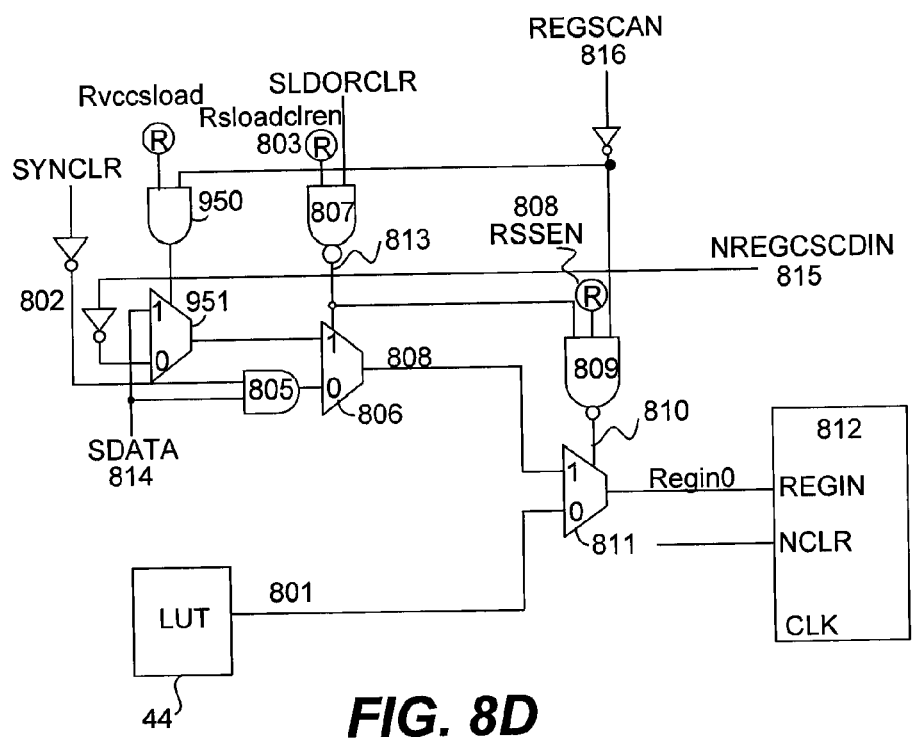
FIG. 8D shows a further alternative embodiment of the present invention in which the SLOAD signal can be tied-off independent of region-wide signals.

In yet another embodiment shown in FIG. 8D, the aforementioned circuits are modified yet again. With this embodiment, NREGSCAN is allowed to control RVCCSLOAD with AND-gate 950, which otherwise lets SDATA through, and at the same time nSYNCLR allows SDATA through the 0-input of mux 806. Thus, if SLOAD is set for the LAB, then SLDORCLR=1 and we can set RSLOADCLREN to GND and RVCCSLOAD to VCC, resulting in the value of SDATA being propagated through input 1 of MUX 951 (accomplishing the goal of overriding the global SLOAD=GND). When it is not desirable for SLOAD to be tied to VCC, we set RVCCSLOAD=GND which forces MUX 951 to propagate NREGSCDIN (which could then be selected or not by the later circuitry).

Figure 9:
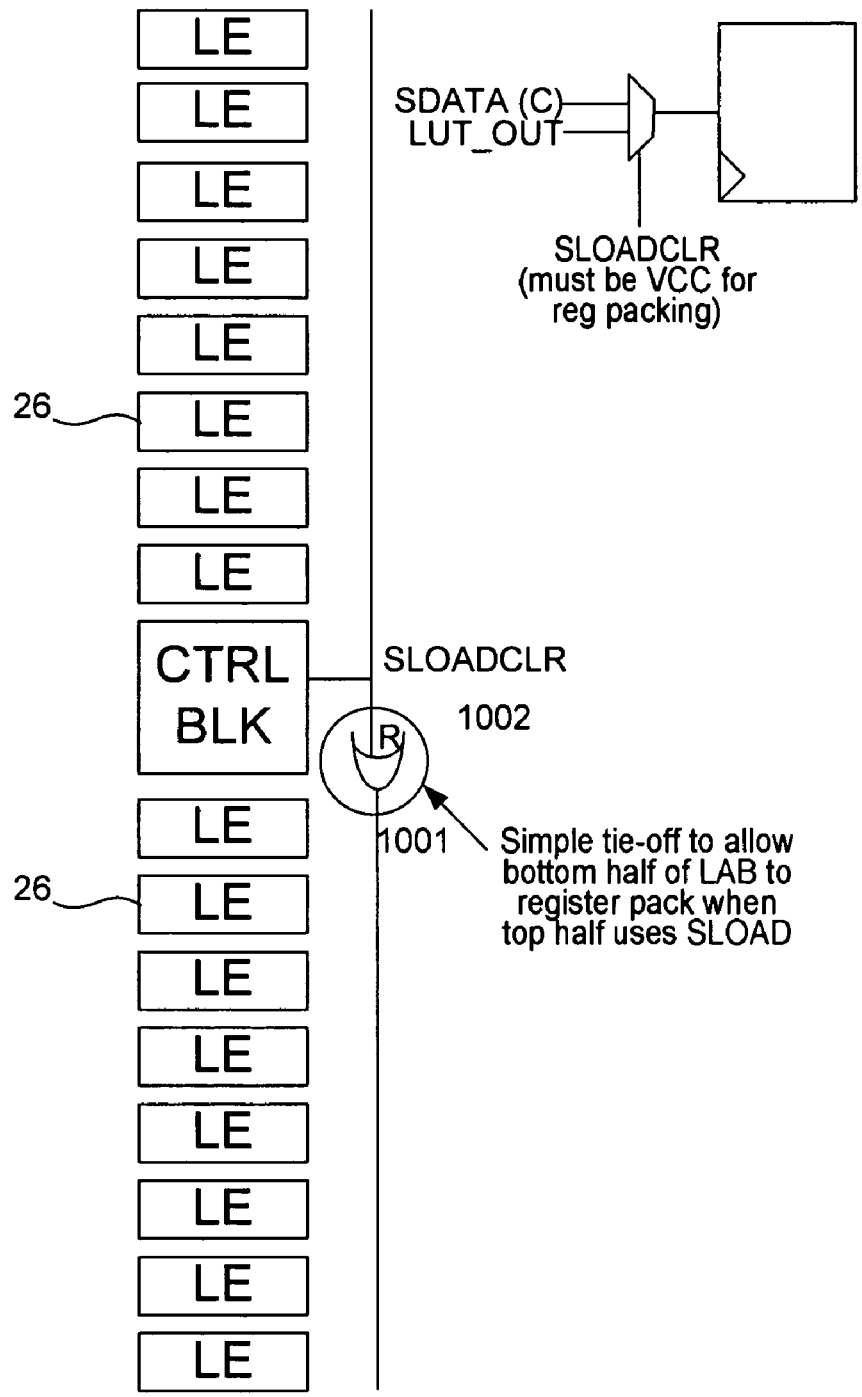
FIG. 9 shows an alternative embodiment of the current invention in which the tie-off bit for an exemplary control signal is set at a sub-region level of granularity.

In another alternate embodiment, a sub-region tie-off, not an individual Logic Element tie-off, is provided. Referring to FIG. 9, the bottom half of a LAB 14 has the SLOAD signal forced to VCC by OR-gate 1001. The OR gate 1001 is controlled by control bit 1002. In other embodiments, an AND or some other type of logic can gate can be used to force the value to zero. Although in the embodiment shown the tie-off divides the LAB 14 into two equal halves. It should be understood that is arrangement is arbitrary, and the tie-off can be placed at any location, dividing the LAB 14 into a sub-region of a quarter, a third, or any other suitable arrangement. It also should be noted that the sub-region tie off can be used for any LAB wide signals 42. It should be further understood, that the various embodiments can be combined to provide further embodiments. For example, in one such embodiment the half-region tie-off of FIG. 9 is used to provide tie-off to SLOAD=VCC for the bottom half of the LAB, and any of the individual schemes of FIGS. 8A to 8D could be used only on the top-half for more finely-grained control.

As previously noted, programming software is for use with programming PLDs. The programming software therefore has to be modified to implement the present invention. Thus, in the programming software used for example to program the Altera or Xilinx PLDs, a tie-off settings module is included. The tie-off settings module is engineered to set one or more configuration bits to set one or more tie-off circuits in a selected individual logic element or sub-region on the programmable logic device. The one or more tie-off circuits are further configured to selectively over-ride the application of one or more of the region-wide control signals to the one or more logic elements in the selected region respectively. The region wide signals may include any of the aforementioned region-wide signals used in the LABs of the Altera devices or the Complex Logic Blocks (CLBs) of the Xilinx devices.

Although the present invention was described in the context of a specific type of programmable logic device having LABs as the exemplary regions, it should be noted that the present invention can be practiced and used in any type of programmable logic device capable having regions using combinations of look up tables, product terms or other logic arrangements for implementing logic functions. For example, the present invention can be used in programmable gate array (FPGA), including those having ALMs or Complex Logic Blocks or slices as their basic logic block. For more information on Complex Logic Blocks and slices, see the Virtex Family Overview by Xilinx Corporation, Mar. 26, 2005, incorporated by reference herein for all purposes. Thus for the purpose of this application, the term "logic regions" is generically or broadly used to mean any area of logic containing a plurality of grouped elements capable of performing logic functions.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An apparatus, comprising:
 a programmable logic device having an array of interconnected logic regions, each of the logic regions further comprising:
  a plurality of logic elements;
  a plurality of logic region wide control signals, the plurality of logic region wide control signals being configured to be applied to each of the plurality of logic elements in the logic region in parallel; and
  a plurality of programmable tie-off circuits configurable for register packing associated with each of the plurality of logic elements respectively, each including a logic gate coupled to receive a configuration bit, the programmable tie-off circuits being set to selectively override one or more of the plurality of logic region wide control signals when the configuration bit is set to a register packing state without enabling any other logic region wide control signal and to allow the one or more logic region wide control signal to be applied to the associated logic element when the configuration bit is set to a second state;
 wherein each of the plurality of programmable tie-off circuits selectively and independently overrides the logic region wide control signal when the configuration bit is set to the register packing state.

2. The apparatus of claim 1, wherein the logic region wide control signal consists of one or more of the following signals: clock enable, a synchronous clear, asynchronous clear, synchronous load, asynchronous load, reset, or any other secondary signal applied to all of the logic elements in the logic region.

3. The apparatus of claim 2, wherein the plurality of programmable tie-off circuits associated with each logic element is further configured to prioritize the one or more logic region wide control signals.

4. The apparatus of claim 3, wherein the priority among the one or more region wide control signals comprises, from highest to lowest, the following priority: synchronous clear versus synchronous load.

5. The apparatus of claim 3, wherein the priority among the one or more region wide control signals comprises, from highest to lowest, the following priority: synchronous load versus synchronous clear.

6. The apparatus of claim 1, wherein the logic region wide control signal consists of one or more of the following: a register set-reset (SR) signal, a toggle signal, or data value signal.

7. The apparatus of claim 1, wherein the logic gate is an AND gate.

8. The apparatus of claim 1, wherein the logic gate is an OR gate.

9. The apparatus of claim 1, wherein the logic gate is coupled to receive the configuration bit and a compound signal.

10. The apparatus of claim 9, wherein the compound signal is selected from one of the following types of compound signals: SLOADORCLR, SET-RESET (SR), a toggle signal, or a data value signal.

11. An apparatus, comprising:
 a programmable logic device having an array of interconnected logic regions, each of the logic regions further comprising:
  a plurality of logic elements arranged in a first sub-region and a second sub-region;
  a logic region wide control signal, the logic region wide control signal being configured to be applied to each of the plurality of logic elements in the first sub-region and the second sub-region of the logic region in parallel; and
  a programmable tie-off circuit associated with the first sub-region, including a logic gate coupled to receive a configuration bit, the programmable tie-off circuit being set to selectively and independently override the logic region wide control signal when the configuration bit is set to one state without enabling any other logic region wide control signal and to allow the logic region wide control signal to be applied to the associated logic element when the configuration bit is set to a second state;
 wherein the programmable tie-off circuit being configured to selectively and independently override the logic region wide control signal when asserted in the first sub-region so that the logic region control signal is not applied to the logic elements arranged in the first sub-region respectively.

12. The apparatus of claim 11, wherein the logic region wide control signal or more of the consists of one following signals: clock enable, a synchronous clear, asynchronous clear, synchronous load, asynchronous load, reset, or any other secondary signal applied to all of the logic elements in the logic region.

13. The apparatus of claim 12, wherein the programmable tie-off circuit is further configured to prioritize the one or more logic region wide control signals.

14. The apparatus of claim 13, wherein the priority among the one or more region wide control signals comprises, from highest to lowest, the following priority: synchronous clear versus synchronous load.

15. The apparatus of claim 13, wherein the priority among the one or more region wide control signals comprises, from highest to lowest, the following priority: synchronous load versus synchronous clear.

16. The apparatus of claim 11, wherein the logic region wide control signal consists of one or more of the following: a register set-reset (SR) signal, a toggle signal, or data value signal.

17. The apparatus of claim 11, wherein the logic gate is an AND gate.

18. The apparatus of claim 11, wherein the logic gate is an OR gate.

19. The apparatus of claim 11, wherein the logic gate is coupled to receive the configuration bit and a compound signal.

20. The apparatus of claim 19, wherein the compound signal is selected from one of the following types of compound signals: SLOADORCLR, SET-RESET (SR), a toggle signal, or a data value signal.

21. The apparatus of claim 11, wherein the number of the plurality of logic elements arranged in first sub-region and second sub-region have one of the following ratios: (i) half of the logic elements in each of the first sub-region and the second sub-region; (ii) one third of the logic elements in the first sub-region and two thirds in the second sub-region; or (iii) twenty five percent of the logic elements in the first sub-region and seventy five percent in the second sub-region.

22. A computer readable storage device comprising:

a programming software for use with programming a programmable logic device having logic regions of logic elements at least partially controlled by logic region wide control signals that are applied to each of the plurality of logic elements in the logic region in parallel, wherein the programming software comprises:

a tie-off setting module configured to set one or more configuration bits to set one or more tie-off circuits in a selected logic region on the programmable logic device, the one or more tie-off circuits being configured to perform register packing by selectively and independently overriding the application of one or more of the logic region wide control signals to the one or more logic elements in the selected logic region respectively without enabling any other logic region wide control signal.

23. The computer readable medium of claim 22, wherein the one or more of the logic region wide control signals consists of one or more of the following signals: clock enable, a synchronous clear, asynchronous clear, synchronous load, asynchronous load, reset, or any other secondary signal applied to all of the logic elements in the logic region.

24. The computer readable medium of claim 22, wherein the logic region wide control signal consists of one or more of the following: a register set-reset (SR) signal, a toggle signal, or data value signal.

* * * * *